United States Patent [19]

Merritt et al.

[11] Patent Number: 4,926,083
[45] Date of Patent: May 15, 1990

[54] OPTICALLY MODULATED ACOUSTIC CHARGE TRANSPORT DEVICE

[75] Inventors: Sears W. Merritt; Robert N. Sacks; Arthur G. Foyt, all of Glastonbury, Conn.

[73] Assignee: United Technologies Corporation, Hartford, Conn.

[21] Appl. No.: 283,624

[22] Filed: Dec. 13, 1988

[51] Int. Cl.$^5$ .................................... H01L 41/08
[52] U.S. Cl. ...................... 310/313 R; 324/77 K; 350/358
[58] Field of Search .......... 310/313 R, 313 A, 313 D; 333/151, 153, 194, 195; 324/77 R, 77 K; 350/358, 371, 372, 373, 162.12, 162.14; 346/157, 160; 357/24, 91; 364/821, 822, 860, 861, 728.1; 332/2, 3, 26

[56] References Cited

U.S. PATENT DOCUMENTS

| | | | |
|---|---|---|---|
| 3,886,527 | 5/1975 | Bert et al. | 310/313 R |
| 3,903,364 | 9/1975 | Lean | 310/313 R X |
| 3,970,778 | 7/1976 | Adkins | 310/313 R X |
| 4,016,412 | 4/1977 | Stern et al. | 310/313 R X |
| 4,097,900 | 6/1978 | Moulin et al. | 310/313 R X |
| 4,380,864 | 4/1983 | Das | 310/313 R S |
| 4,525,442 | 6/1985 | Shirai et al. | 357/2 X |
| 4,592,130 | 6/1986 | Nash | 357/41 X |
| 4,600,853 | 7/1986 | Whitlock et al. | 310/313 R X |
| 4,611,140 | 9/1986 | Whitlock et al. | 310/313 R X |
| 4,683,395 | 7/1987 | Mitsutsuka | 310/313 R |
| 4,695,790 | 9/1987 | Mathis | 324/77 K |
| 4,757,226 | 7/1988 | Mitsutka et al. | 310/313 R X |
| 4,758,895 | 7/1988 | Elabd | 358/213.26 |

*Primary Examiner*—Mark O. Budd
*Attorney, Agent, or Firm*—McCormick, Paulding & Huber

[57] ABSTRACT

A novel heterojunction acoustic charge transport device includes a transducer fabricated on a GaAs/AlGaAs heterojunction material that launches surface acoustic waver (SAW) along a transport channel. The device is characterized by a photodiode configured adjacent to the channel on the substrate to receive a modulated optical beam. An electrical signal equivalent is provided to a Schottky electrode at the end of the transport channel modulating the charge propagated by the surface acoustic wave. The modulated signal is output at a distal end of the transport channel.

12 Claims, 2 Drawing Sheets

4,926,083

OPTICALLY MODULATED ACOUSTIC CHARGE TRANSPORT DEVICE

TECHNICAL FIELD

This invention relates to acoustic charge transport devices and more particularly to acoustic charge transport devices responsive to optical modulation.

CROSS REFERENCE TO RELATED APPLICATIONS

Some of the subject matter hereby is disclosed and claimed in the commonly owned, copending U.S. patent applications entitled "Acoustic Charge Transport Device Having Direct Optical Input" and "A Monolithic Electro-Acoustic Device Having An Acoustic Charge Transport Device Integrated With A Transistor", each of which is incorporated herein by reference.

BACKGROUND OF THE INVENTION

Acoustic charge transport (ACT) phenomena in III-IV semiconductor material has only recently been demonstrated. Such devices have applications at high speed analog signal processors. Delay lines have been fabricated in gallium arsenide (GaAs) substrates comprising a surface acoustic wave (SAW) transducer that launches a surface acoustic wave along an upper layer of the GaAs substrate having transport channel formed therein. An input ohmic electrode sources charge to be transported by the propagating potential wells and a Schottky control electrode receives a signal for modulating that charge. Spaced down the transport channel are one or more nondestructive sensing electrodes for sensing the propagating charge and finally an ohmic output electrode for removing the charge.

Initial acoustic charge transport devices comprised a thick epilayer with vertical charge confinement accomplished by means of an electrostatic DC potential applied to metal field plates on the top and bottom surfaces of the GaAs substrate. The field plate potentials are adjusted to fully deplete the epilayer and produce a potential maximum near the midpoint thereof. Consequently, any charge injected into the channel is confined to the potential minimum.

Lateral charge confinement (Y direction) has been achieved in several ways. Typically, a mesa is formed to define a charge transport channel. However, for thick epilayer acoustic transport devices, the mesa must be several microns in height, a fact which presents problems in fabrication and is a major impediment to the propagating surface acoustic wave. Blocking potentials extending down both sides of the delay line have also been used to define the transverse extent of the channel, as has proton bombardment to render the material surrounding the channel semi-insulating.

Recently a heterostructure acoustic charge transport (HACT) device has been fabricated using a GaAs/AlGaAs heterostructure that is similar to that of quantum well lasers and heterostructure field effect transistors (FET). A HACT device vertically confines mobile carriers through the placement of potential steps that result from band structure discontinuities. Besides providing for inherent vertical charge confinement, the HACT devices are thin film devices whose layers have a total thickness of approximately 0.25 microns, excluding a buffer layer.

Known HACT devices provide only for electrical modulation of the charge propagating with the surface acoustic wave. It would be advantageous to have a heterostructure acoustic charge transport device which is capable of charge modulation by an input signal comprised of an optical beam. The present invention is drawn towards such a device.

SUMMARY OF THE INVENTION

An object of the present invention is to provide a heterostructure acoustic charge transport device which is responsive to optical signals.

According to the present invention a heterostructure acoustic charge transport device responsive to an optical input signal includes an acoustic charge transport structure formed on a piezoelectric, semiconducting substrate including a transducer fabricated on a surface of the substrate and launches surface acoustic waves therealong. The surface acoustic waves are characterized by maxima and minima electric potential which transport electric charges provided thereto. A reflector is formed in the surface at an end portion thereof adjacent to the transducer to reflect the surface acoustic waves. The device also includes a first electrode formed on the surface for providing electrical charges to the surface acoustic waves. A transport channel is formed in the substrate along the surface and provides lateral and vertical confinement of charges propagating with the surface acoustic waves. A second electrode is configured on the surface which modulates the potential barrier height thereof in accordance with the input signal and controls the amount of propagating charge. At a distal end of the transport channel a third electrode provides an electrical signal equivalent to the modulated charge and a fourth electrode to remove the propagating charge. The device is characterized by a photodiode configured in the substrate which generates the modulation signals in accordance with a modulated optical beam received therein.

DESCRIPTION OF THE PREFERRED EMBODIMENT

Figure 1:
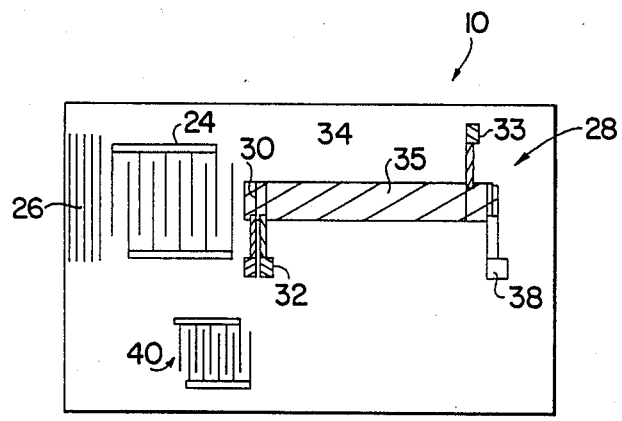
FIG. 1 is a simplified illustration of an acoustic charge transport device provided according to the present invention.

Referring now to FIG. 1 there is a schematic illustration of an optically modulated acoustic charge transport device provided according to the present invention. The device 10 is preferably comprised of a III-IV material, such as GaAs and AlGaAs which is both piezoelectric and semiconducting. As is known, these materials are very closely lattice matched, having lattice parameters that differ by less than 0.0008 nm. As a result, their ternary solutions are nearly ideal for preparation by epitaxial growth. In addition, the energy band gap of an AlGaAs compound ($Al_xGa_{1-x}As$) increases monotonically with the parameter x up to x approximately equal to 0.4, at which point the band gap of the ternary becomes indirect. Potential steps as large as 0.3 ev can be obtained in a heterostructure device.

The device 10 provides vertical charge confinement through formation of a potential well within a GaAs-/AlGaAs layered structure using the differences in the conduction band energies of the contiguous layers. No external applied potentials are required for charge confinement in the vertical direction in the device 10. Moreover, the heterojunction band structure potential is a property of the composite material alone and is not diminished by the transport charge load. A direct optically modulated HACT is described and claimed in the aforementioned U.S. patent application entitled "Acoustic Charge Transport Device Having Direct Optical Input".

Figure 2:
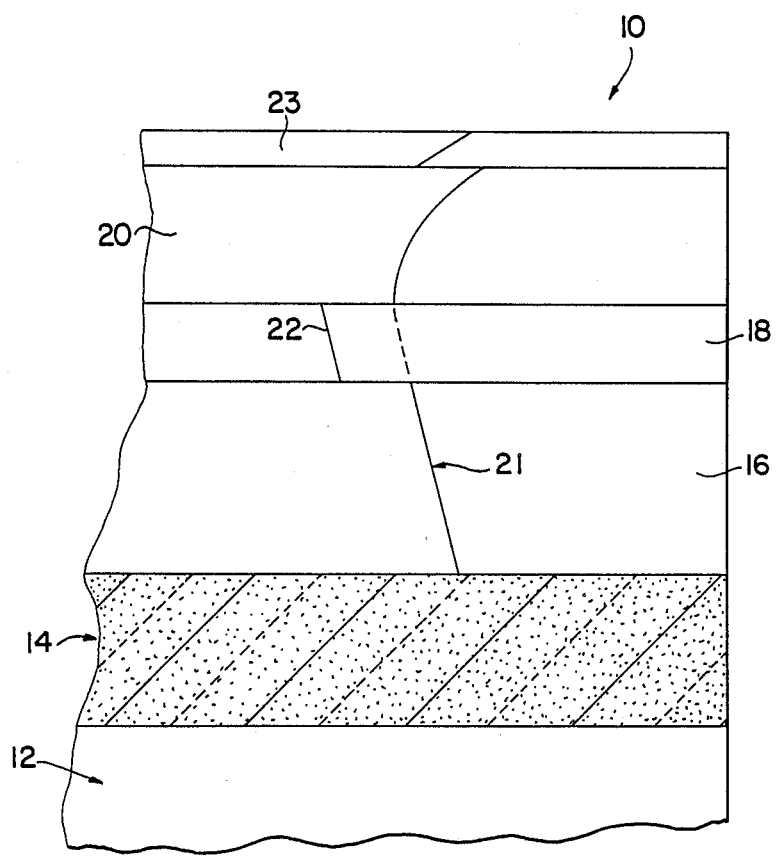
FIG. 2 is a diagrammatic illustration showing conduction band potential across several material layers in the device of FIG. 1.

Referring now to FIG. 2 there is shown a sectioned diagrammatic illustration showing conduction band potential across the material layers in the device of FIG. 1. On a semi-insulating GaAs substrate 12 there is formed a (AlGa)As or GaAs buffer layer 14. A first, unintentionally doped layer 16 of (AlGa)As is then grown on the buffer layer and receives a layer 40 nm thick layer 18 of GaAs which forms the transport channel. The first layer 16 is not intentionally doped. A second upper layer 20 of (AlGa)As is grown on the layer 18 with a doping of $2 \times 10^{17}$ and a thickness of roughly 70 nm.

As indicated by the conduction band potential of GaAs layers 18 and (AlGa)As layers 16 and 20 (curves 21 and 22), a potential well 0.25 ev deep is created in the GaAs layer 18 which serves to confine the charge in the transport channel. The thickness and doping level of the (AlGa)As layer 20 is designed to provide a sufficient number of electrons to fill the surface states therein while leaving the remainder of structure essentially free of excess carriers. In the device of FIG. 1, a mole fraction of 32% aluminum was used. Finally, a cap layer 23 of unintentionally doped GaAs is formed in order to prevent oxidation of the (AlGa)As charge control layer 20 and to aid in electrical contact formation. As noted above, the heterostructure structure described with respect to FIG. 2 provides for vertical charge confinement and eliminates the need for backgating consideration and external biasing, as is necessary for conventional acoustic charge transport devices.

The transport channel formed in the device 10 differs from a double heterostructure FET devices in that the charge in a FET transistor is supplied by donors in the (AlGa)As layers. However, with the HACT device 10, the transport channel is initially empty and charges are pulled into the channel through an ohmic contact by the surface acoustic wave potential. The GaAs transport channel is undoped to provide high electron mobility, and there is an increased charge transfer efficiency due to a limited charge packet volume and lower bulk charge trapping.

Referring again to FIG. 1 there is illustrated on the surface of the device 10 a surface acoustic wave transducer 24 and reflector 26. The transducer is formed in a known manner and preferably comprises an interdigitated (IDT) transducer of aluminum copper alloy deposited on surface 28. Similarly, the reflector 26 comprises a plurality of etched grooves or metal strips formed in a known manner to reflect the surface acoustic wave along the surface 28. Spaced on the surface from the transducer is an input ohmic electrode 30 for providing a supply of charge. The charge is received by the surface acoustic wave in potential wells and is propagated along the device in the transport channel. The potential barrier height controls the amount of propagating charge and is modulated in accordance with signals provided at the input Schottky electrode 32. Lateral confinement of the propagating charge is preferably accomplished by proton implant to produce a semi-insulating area 34 surrounding the channel 35 on the surface 28. The charge is extracted from the device at the output ohmic electrode 38.

As described hereinabove, the heterostructure device 10 is a thin film device whose charge confinement layers have a total thickness typically less than 0.25 micron, excluding the buffer layer. Consequently, a HACT device is amenable to fabrication techniques, such as molecular beam epitaxy, which can generate structures with precisely controlled thickness and doping. One drawback to known HACT devices is that direct optical modulation is essentially precluded, since optical absorption in GaAs occurs primarily at depths of approximately one micron, well beyond the thin film structure.

However, the device 10 provides for optical coupling by including a separate means fabricated on the substrate adjacent to the acoustic charge transport structure that converts a received electromagnetic beam into corresponding electron-hole pairs. In the device 10, a Schottky diode 40 is formed on the semi-insulating GaAs substrate. The construction of the diode is known. Therefore, fabrication of the diode is complementary to that of the acoustic charge transport structure. The heterostructure layers are preferably grown on the wafer as detailed hereinabove and are etched away in all areas except where needed for the acoustic charge transport structure.

Figure 3:
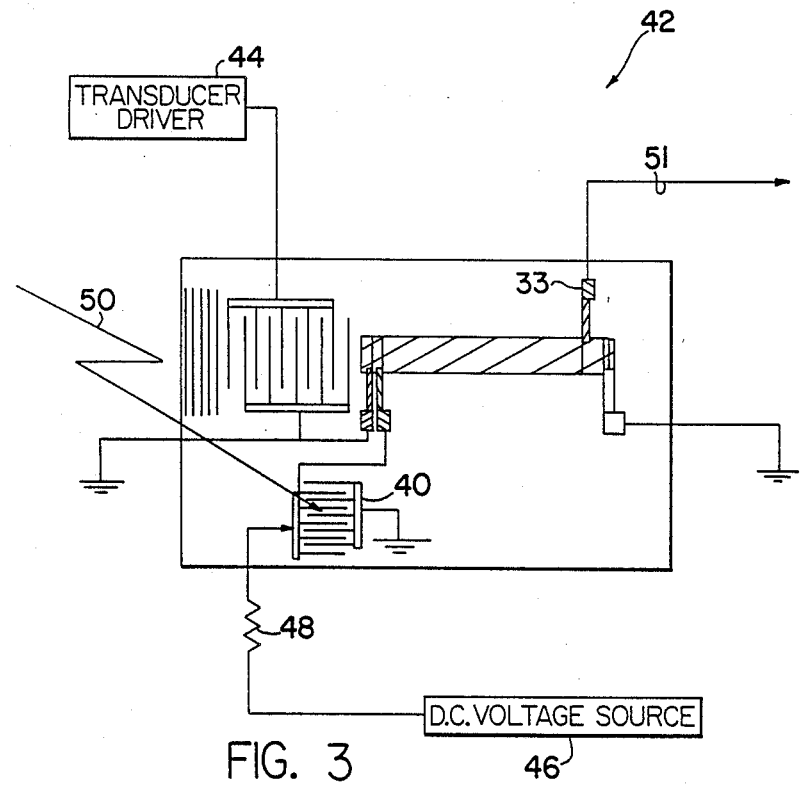
FIG. 3 is a simplified illustration of a circuit employing the device of FIG. 1.

A simplified schematic illustration of a circuit employing the device 10 is shown in FIG. 3. Besides the device 10, circuit 42 includes a transducer driver 44 for launching the surface acoustic waves along the transport channel. An external signal bias supply 46 is included, as is a series resistor 48 configured with the diode 40 and input Schottky contact 32 to form a voltage divider. The electron hole pairs form as optical beam 50 irradiates the diode to generate a correspondingly modulated voltage at the input Schottky electrode 32. The signal presented at electrode 32 modulates the charge transported by the moving surface acoustic waves as described hereinabove. The modulated signal is presented at Schottky electrode 33 to external circuitry on lines 51.

Figure 4:
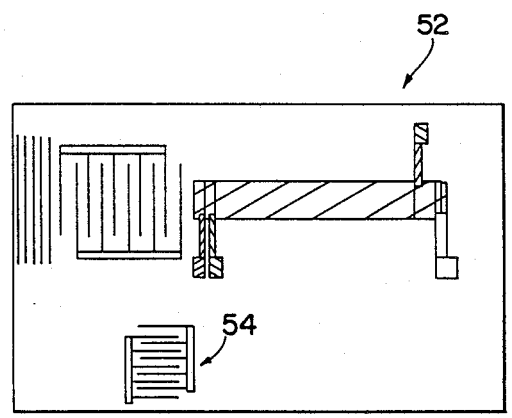
FIG. 4 is a simplified illustration of an alternative device to that of FIG. 1.

FIG. 4 illustrates an alternative device 52 to the device 10 of FIG. 1. The alternative device 52 is similar in design and material to the device 10 but is characterized by ohmic electrodes 54 which are formed on the surface of the substrate as described hereinabove with respect to diode 40. Ohmic contact metals are deposited to define the electrodes 54 which are subsequently alloyed with the substrate. For lower contact resistance, the ohmic electrode regions can be doped n+ by ion implantation prior to metallization. Note that the above fabrication procedure is the same as used to form the ohmic contacts for the acoustic charge transport structure, so no new processing steps are required for the ohmic electrodes 54. In a circuit, the ohmic electrodes 54 are configured as described with respect to the diode 40 of FIG. 3 such that the resistance presented by electrodes 54 varies as a function of the electromagnetic radiation incident thereto.

Similarly, although the invention has been shown and described with respect to a preferred embodiment thereof, it should be understood by those skilled in the art that various other changes, omissions and additions thereto may be made therein without departing from the spirit and scope of the present invention. Specifically those skilled in the art will note that a number of alternative photoconducting structures can be substituted for those detailed hereinabove, such as P-I-N diodes and phototransistors with appropriate modifications to the device.

We claim:

1. An acoustic charge transport device capable of responding to optical modulation comprising:
    an acoustic charge transport structure formed on a piezoelectric semiconducting substrate including
        a transducer means fabricated on a first surface of the substrate for launching surface acoustic waves along a propagation axis, said surface acoustic waves characterized by maxima and minima of electrical potential which transport electric charges provided thereto;
        a reflector means formed in said surface at an end portion thereof adjacent to said transducer means for reflecting said surface acoustic waves;
        a first electrode means for providing electrical charges to said surface acoustic waves,
        a transport channel formed in said substrate to have a major dimension extending parallel to said propagation axis, said channel for receiving said charges and providing lateral and vertical confinement of said charges propagating with said surface acoustic waves;
        a second electrode means receiving modulation signals and electrically configured with said transport channel to alter the electrical potential barrier height therein in accordance with said modulation signals, thereby controlling the amount of propagating charge,
        a third electrode means for providing an electrical signal equivalent of said propagating electrical charge;
        a fourth electrode means configured with said transport channel at an end thereof distal to said first electrode means for removing said propagating charge; and
    a photoconverter means configured in said substrate for generating said modulation signals in accordance with a modulated optical beam received therein.

2. The device of claim 1 wherein said acoustic charge transport structure further comprises an ion implanted region encompassing said transport channel for providing lateral confinement of said propagating charge.

3. The device of claim 1 wherein said photoconverter means further comprises a Schottky diode.

4. The device of claim 1 wherein said photoconverter further comprises a P-I-N diode.

5. The device of claim 1 wherein said photoconverter means further comprises a phototransistor.

6. The device of claim 1 wherein said photoconverter means further comprises a photoresistor.

7. The device of claim 1 wherein said substrate comprises Group III-V materials.

8. The device of claim 7 wherein said material comprises gallium arsenide.

9. The device of claim 7 wherein said structure comprises a heterojunction structure including an unintentionally doped aluminum-gallium arsenide layer formed on said substrate, an unintentionally doped gallium arsenide layer grown on said aluminum-gallium arsenide layer and a doped aluminum-gallium arsenide layer grown on said unintentionally doped gallium arsenide layer.

10. The device of claim 9 wherein said structure further comprises a gallium arsenide cap layer.

11. The device of claim 10 wherein photoconverter means is configured in said substrate adjacent said structure.

12. An electrical circuit for use in converting a modulated optical beam in corresponding electrical modulation signals, comprising:
    a direct optically modulated acoustic charge transport device, having an acoustic charge transport structure formed on a piezoelectric semiconducting substrate including
        a transducer means fabricated on a first surface of the substrate for launching surface acoustic waves along a propagation axis, said surface acoustic waves characterized by maxima and minima of electrical potential
        a reflector means formed in said surface at an end portion thereof adjacent to said transducer means for reflecting said surface acoustic waves;
        a first electrode means for providing electrical charges to said surface acoustic waves,
        a transport channel formed in said substrate to have a major dimension extending parallel to said propagation axis, said channel for receiving said charges and providing lateral and vertical confinement of said charges propagating with said surface acoustic waves,
        a second electrode means receiving modulation signals and electrically configured with said transport channel to alter the electrical potential barrier height therein in accordance with said modulation signals, thereby controlling the amount of propagating charge,
        a third electrode means for providing an electrical signal equivalent of said propagating electrical charge;
        a fourth electrode means configured with said transport channel at an end thereof distal to said first electrode means for removing said propagating charge; and
    a photoconverter means configured in said substrate for generating said modulation signals in accordance with a modulated optical beam received therein;
    a means for supplying electrical bias signals to said photoconverter signal generator means; and
    a transducer driver means for supplying to said transducer means electrical signals corresponding to said surface acoustic waves.

* * * * *